(12) United States Patent
Rountree

(10) Patent No.: US 8,872,223 B2
(45) Date of Patent: Oct. 28, 2014

(54) PROGRAMMABLE SCR FOR ESD PROTECTION

(71) Applicant: Robert Newton Rountree, Richardson, TX (US)

(72) Inventor: Robert Newton Rountree, Richardson, TX (US)

( * ) Notice: Subject to any disclaimer, the term of this patent is extended or adjusted under 35 U.S.C. 154(b) by 0 days.

(21) Appl. No.: 13/762,345

(22) Filed: Feb. 7, 2013

(65) Prior Publication Data
US 2013/0200428 A1    Aug. 8, 2013

Related U.S. Application Data

(60) Provisional application No. 61/596,364, filed on Feb. 8, 2012.

(51) Int. Cl.
| | |
|---|---|
| H01L 29/73 | (2006.01) |
| H01L 21/331 | (2006.01) |
| H01L 27/04 | (2006.01) |
| H01L 21/82 | (2006.01) |
| H01L 27/02 | (2006.01) |
| H01L 29/74 | (2006.01) |

(52) U.S. Cl.
CPC ............... *H01L 27/04* (2013.01); *H01L 21/82* (2013.01); *H01L 27/0262* (2013.01); *H01L 29/7436* (2013.01)
USPC .......................................... 257/173; 257/355

(58) Field of Classification Search
CPC . H01L 27/0262; H01L 29/7436; H01L 29/87; H01L 2924/13055
USPC ........................... 257/107, 173, 355, E29.181
See application file for complete search history.

(56) References Cited

U.S. PATENT DOCUMENTS

| | | | |
|---|---|---|---|
| 4,939,616 A | 7/1990 | Rountree | |
| 5,012,317 A | 4/1991 | Rountree | |
| 5,465,189 A | 11/1995 | Polgreen et al. | |
| 6,680,833 B2 | 1/2004 | Morishita | |
| 2002/0163009 A1* | 11/2002 | Ker et al. | 257/107 |
| 2004/0100745 A1 | 5/2004 | Chen et al. | |
| 2010/0172059 A1 | 7/2010 | Chaine et al. | |
| 2011/0133247 A1* | 6/2011 | Sarbishaei et al. | 257/173 |

* cited by examiner

*Primary Examiner* — Cuong Q Nguyen

(57) ABSTRACT

A programmable semiconductor controlled rectifier (SCR) circuit is disclosed. The SCR includes a first terminal (310) and a second terminal (308). A first lightly doped region (304) having a first conductivity type (N−) is formed on a second lightly doped region (314) having a second conductivity type (P−). A first heavily doped region having the second conductivity type (P+) is formed within the first lightly doped region at a face of the substrate and coupled to the first terminal. A second heavily doped region having the first conductivity type (N+) is formed within the second lightly doped region at the face of the substrate and coupled to the second terminal. A third heavily doped region (400) having the second conductivity type (P+) is formed at least partially within the first lightly doped region at the face of the substrate between the first and second heavily doped regions and electrically connected to the second lightly doped region.

20 Claims, 2 Drawing Sheets

US 8,872,223 B2

PROGRAMMABLE SCR FOR ESD PROTECTION

This application claims the benefit under 35 U.S.C. §119 (e) of Provisional Appl. No. 61/596,364, filed Feb. 8, 2012, which is incorporated herein by reference in its entirety.

BACKGROUND OF THE INVENTION

Embodiments of the present embodiments relate to a programmable semiconductor controlled rectifier (SCR) for electrostatic discharge (ESD) protection and having programmable switching and holding voltages.

Referring to FIG. 1A, there is a current-voltage diagram of a semiconductor controlled rectifier (SCR) of the prior art. FIG. 1B is a simplified diagram of the SCR showing the PNPN impurity layers and intervening junctions J1-J3. Here and in the following discussion it should be understood that a semiconductor controlled rectifier may also be called a silicon controlled rectifier or a thyristor as described by S. M. Sze, "Semiconductor Devices Physics and Technology" 148-156 (John Wiley & Sons 1985). In general, a silicon controlled rectifier is a special case of a semiconductor controlled rectifier that is specifically formed on a silicon substrate. The current-voltage diagram shows a reverse blocking region 100 where junctions J1 and J3 are reverse biased, but junction J2 is forward biased. By way of contrast, junctions J1 and J3 are forward biased, but junction J2 is reverse biased in the forward blocking region 102. At switching voltage Vsw 104, the SCR switches from the forward blocking region to a minimum holding voltage (Vh) and holding current (Ih) region 106. Each point along line 108 is a relatively higher holding current and holding voltage, and the slope of line 108 represents the on resistance of the SCR. In this mode all three junctions J1-J3 are forward biased and the minimum holding voltage across the SCR may be as low as a single diode drop or approximately 0.7 V. In holding regions 106 and 108, therefore, the SCR functions as a near ideal switch with very little power dissipation due to the low holding voltage and holding current.

SCRs have been used for primary protection against electrostatic discharge (ESD) for several years. Rountree first disclosed a lateral SCR for ESD protection (FIG. 2A) in U.S. Pat. No. 5,012,317, issued Apr. 30, 1991, having a priority date of at least Apr. 14, 1986. The SCR was also described in detail by Rountree et al. in "A Process Tolerant Input Protection Circuit for Advanced CMOS Processes" (EOS/ESD Symposium Proceedings, pp. 201-205, 1988). The SCR was connected between input terminal 200 and ground terminal 202. The SCR provided a significant improvement in failure threshold over existing ESD protection circuits. However, it required a relatively high switching voltage (Vsw) to induce avalanche conduction at the N– and P– 204 linear junction J2.

Rountree subsequently disclosed a low voltage SCR for ESD protection (FIG. 2B) in U.S. Pat. No. 4,939,616, issued Jul. 3, 1990, having a priority date of at least Nov. 1, 1988. The low voltage SCR maintained the substantially improved failure threshold of the original lateral SCR. The low voltage SCR also substantially reduced the switching voltage (Vsw) required for avalanche conduction by forming an abrupt junction J2 between the N+ and P– regions.

Polgreen et al. later disclosed an even lower voltage SCR for ESD protection (FIG. 2C) in U.S. Pat. No. 5,465,189, issued Nov. 7, 1995, having a priority date of at least Mar. 5, 1990. This SCR modified the SCR of U.S. Pat. No. 4,939,616 by adding a grounded gate n-channel transistor 206 between junctions J2 and J3. The increased electric field at the gate-to-drain overlap region near junction J2 induced avalanche conduction at the SCR switching voltage, which was substantially lower than previously disclosed lateral SCRs. (col. 4, lines 30-35). At the same time, the SCR raised several reliability concerns, because the SCR functioned as a grounded gate n-channel transistor between the forward blocking region 102 and the switching voltage 104. For some processes and test conditions, therefore, it is possible that the gate oxide at the gate-to-drain overlap region near junction J2 may rupture before the SCR turns on.

A common feature of the SCRs of FIGS. 2A through 2C is that the switching voltage of each is determined by the avalanche threshold of p-n junction J2. Other circuits have included secondary protection circuits, such as an isolation resistor and grounded gate n-channel transistor, to achieve a relatively lower switching voltage. This, however, requires the avalanche threshold of the n-channel transistor plus the voltage drop across the isolation resistor to forward bias junction J1. Others have used series-connected diodes to forward bias junction J1. This, however, increases leakage current in normal circuit operation. Still others have used junction-isolated base regions to reduce SCR switching (Vsw) and holding (Vh) voltages. This, however, may require a triple well process or other special isolation techniques. Moreover, any application of a low impedance control signal before the integrated circuit is adequately powered up may cause the SCR to latch and destroy itself. Thus, all these circuits of the prior art offer some advantages albeit with corresponding disadvantages. These and other problems are resolved by the following embodiments of the present invention as will become apparent in the following discussion.

BRIEF SUMMARY OF THE INVENTION

In a preferred embodiment of the present invention, a programmable circuit is disclosed. The circuit includes a first terminal and a second terminal. A first lightly doped region having a first conductivity type is formed on a second lightly doped region having a second conductivity type. A second heavily doped region having the first conductivity type is formed within the second lightly doped region at the face of the substrate and coupled to the second terminal. A third heavily doped region having the second conductivity type is formed at least partially within the first lightly doped region at the face of the substrate between the first and second heavily doped regions and electrically connected to the second to lightly doped region.

DETAILED DESCRIPTION OF THE INVENTION

The preferred embodiments of the present invention provide significant advantages over semiconductor controlled rectifier (SCR) electrostatic discharge (ESD) protection circuits of the prior art as will become evident from the following detailed description.

Figure 1A:
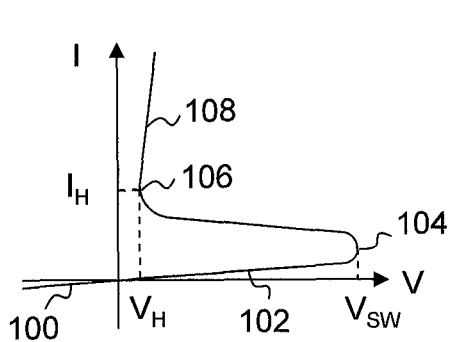
FIG. 1A is a current-voltage diagram of a semiconductor controlled rectifier (SCR) of the prior art.
Figure 1B:
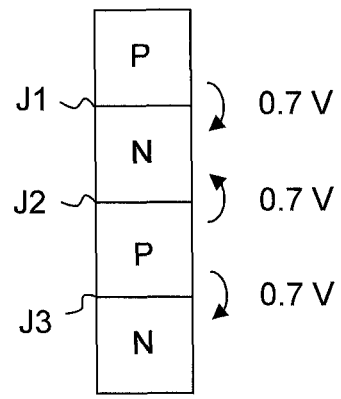
FIG. 1B is a simplified diagram of an SCR of the prior art.
Figure 2A:
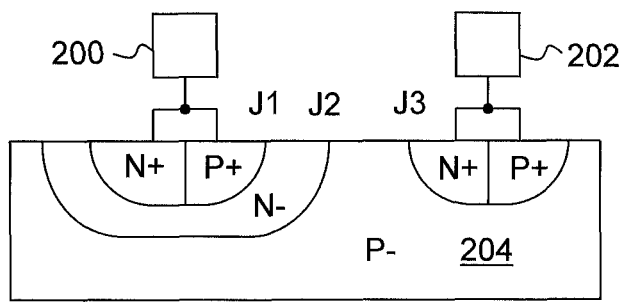
FIG. 2A is a cross sectional view of a lateral SCR of the prior art.
Figure 2B:
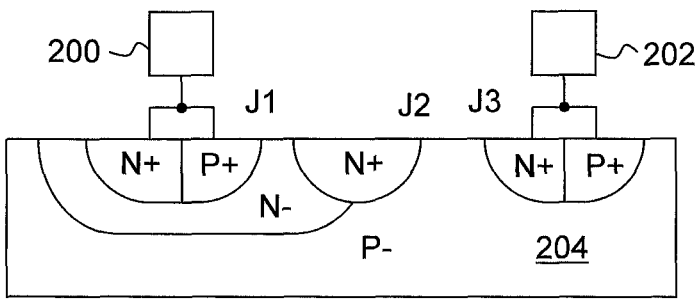
FIG. 2B is a cross sectional view of a low voltage lateral SCR of the prior art.
Figure 2C:
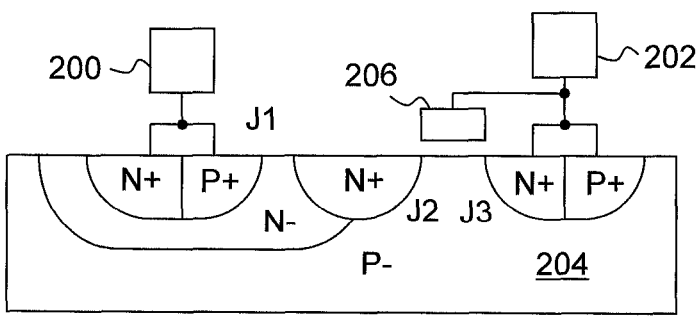
FIG. 2C is a cross sectional view of another low voltage lateral SCR of the prior art.
Figure 3A:
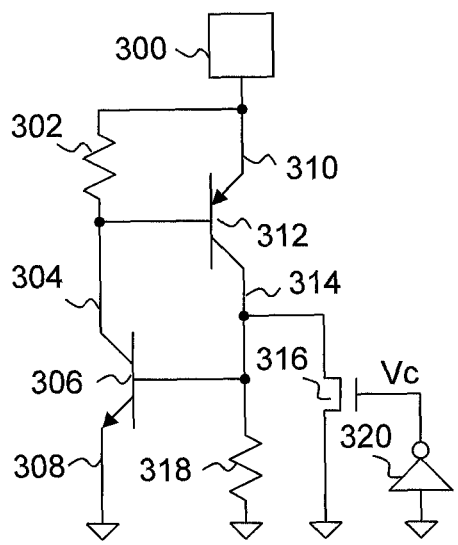
FIG. 3A is a schematic diagram of a programmable SCR of the present invention.

Referring to FIG. 3A, there is a schematic diagram of a programmable semiconductor controlled rectifier (SCR) of the present invention. The SCR includes a PNP bipolar transistor 312 and an NPN bipolar transistor 306 coupled between terminal 300 and Vss or ground as indicated by the small triangle. The emitter 310 of the PNP transistor is connected to terminal 300, which may be a data terminal, an address terminal, a control terminal, or a power supply terminal. A resistor 302 is coupled between the emitter 310 and the base 304 of PNP transistor 312. The base of PNP transistor 312 is connected to the collector of NPN transistor 306. The collector 314 of PNP transistor 312 is connected to the base of NPN transistor 306. The emitter 308 of NPN transistor 306 is connected to ground, Vss, or other suitable reference terminal. Resistor 318 is coupled between the base and emitter terminals of NPN transistor 306. A programmable n-channel transistor 316 is coupled in parallel with resistor 318.

In one embodiment of the present invention, the programmable resistive element 316 is an n-channel transistor having a programmed size, and having off and on states in response to a control voltage Vc. In this embodiment, the control voltage Vc is preferably a power supply voltage Vdd or an equivalent control voltage produced by inverter 320 having a grounded input terminal. When a power supply voltage is not applied to an integrated circuit having the SCR, the n-channel transistor 316 is off. In this case, the holding voltage has a minimum value as determined by resistor 318, which is preferably a parasitic resistor of the lightly doped P− region 314. Alternatively, when the power supply voltage Vdd is applied to the integrated circuit, n-channel transistor 316 is on and is switched in parallel with resistor 318. The parallel combination of resistors 318 and 316 is selected to increase the holding voltage of the SCR to a value slightly above a maximum operating voltage that might be applied to terminal 300. This advantageously provides a high failure threshold when power supply voltage Vdd is not applied to the integrated circuit as well as a higher holding voltage when power supply voltage Vdd is applied to the integrated circuit. Thus, the SCR will not remain latched should an ESD event occur during normal circuit operation. Moreover, inverter 320 advantageously protects the gate oxide of n-channel transistor 316 against charged device model (CDM) stress.

Figure 4A:
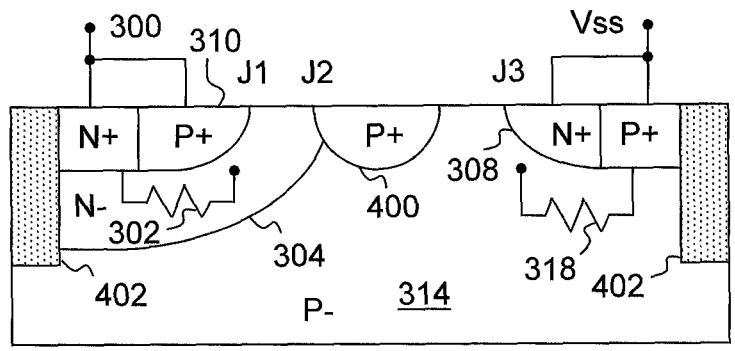
FIG. 4A is a cross sectional diagram of the programmable SCR of FIG. 3A.

Turning now to FIG. 4A, there is a cross sectional diagram of the SCR of FIG. 3A having programmable switching and holding voltages. Here and in the following discussion the same reference numerals are used to indicate the same elements in the various drawing figures. Dielectric isolation regions 402 are preferably shallow trench isolation (STI) regions that provide isolation from other circuits. Heavily doped P+ region 400 is formed between the heavily doped P+ region 310 and the heavily doped N+ region 308. Here, the term heavily doped region is used to indicate a relatively higher impurity concentration than that of a lightly doped region and is indicated by a "+". The spacing and N− 304 impurity concentration between these two highly doped P+ regions 310 and 400 is programmed or selected to induce either avalanche conduction or punch through conduction at the desired switching voltage of the SCR. The spacing between these two P+ heavily doped regions is preferably determined by the P+ ion implantation mask without any intervening dielectric isolation region. Thus, alignment is not critical and the spacing may be approximately the minimum feature size of the integrated circuit. Here, avalanche or punch through is equivalent to collector-to-emitter avalanche conduction or punch through conduction of PNP transistor 312. The onset of either conduction mode produces sufficient base current in NPN transistor 306 to produce a latched state of the SCR. This advantageously permits programming the switching voltage 104 of the SCR with very little influence on the holding voltage 106. Moreover, the absence of any intervening dielectric region greatly improves the current gain of the SCR and produces a very low on resistance.

Figure 3B:
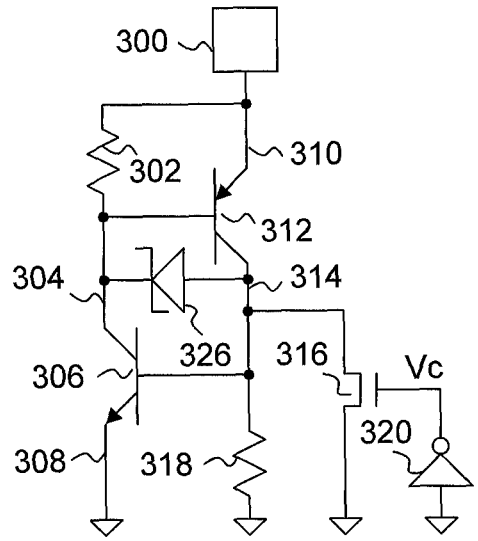
FIG. 3B is a schematic diagram of another programmable SCR of the present invention.
Figure 4B:
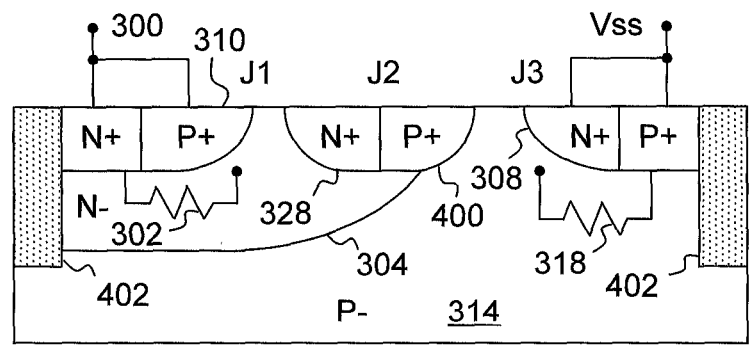
FIG. 4B is a cross sectional diagram of the programmable SCR of FIG. 3B.

Referring now to FIG. 3B, there is a schematic diagram of another programmable SCR of the present invention. This is similar to the SCR of FIG. 3A except that diode 326 is added. FIG. 4B is a cross sectional diagram of the embodiment of the SCR of FIG. 3B having a programmable switching voltage. Diode 326 is added to FIG. 3B between the collector and base of NPN transistor 306 to program the switching voltage of the SCR. The cathode of diode 326 is formed by the heavily doped N+ region 328 and the anode is formed by the heavily doped P+ region 400. Spacing between the cathode and anode is programmed to produce avalanche or punch through conduction at the desired switching voltage of the SCR. The spacing between the N+ cathode and P+ anode regions is preferably determined by the ion implantation mask alignment without any intervening isolation region. In the limit, where a minimum switching voltage of the SCR is desired, the N+ cathode 328 may abut P+ region 400. In this case, the reverse biased diode 326 may conduct due to band-to-band tunneling in zener breakdown mode. Thus, the SCR switching voltage may advantageously be reduced to less than 5 V when power supply voltage Vdd is not applied to the integrated circuit having the SCR. Alternatively, when power supply voltage Vdd is applied to the integrated circuit, n-channel transistor 316 is on and current through diode 326 is divided between resistor 318 and n-channel transistor 316. The relatively lower resistance of resistor 318 in parallel with n-channel transistor 316 increases the SCR switching and holding voltages to a value greater than the maximum operating voltage applied to terminal 300. This advantageously provides a high failure threshold when power supply voltage Vdd is not applied to the integrated circuit as well as a higher switching and holding voltages when power supply voltage Vdd is applied to the integrated circuit. Thus, the SCR will not latch during normal circuit operation and it will not remain latched should an ESD event occur during normal circuit operation.

Still further, while numerous examples have thus been provided, one skilled in the art should recognize that various modifications, substitutions, or alterations may be made to the described embodiments while still falling with the inventive scope as defined by the following claims. For example, preferred embodiments of the present invention have illustrated protection circuits designed for positive ESD stress with respect to ground or Vss. The previously described circuits may also be connected for positive stress with respect to Vdd. Furthermore, anode and cathode connections may be reversed to provide for negative stress with respect to Vss or Vdd. Furthermore, a programmable shunt resistance 316 has been discussed between the base and emitter terminals of NPN transistor 306. A similar programmable shunt resistance may also be employed between the base and emitter terminals of PNP transistor 312. Other combinations will be readily apparent to one of ordinary skill in the art having access to the instant specification.

What is claimed is:

1. A circuit formed on a substrate, comprising:
   a first terminal;
   a second terminal;
   a first lightly doped region having a first conductivity type formed on a second lightly doped region having a second conductivity type;
   a first heavily doped region having the second conductivity type formed within the first lightly doped region at a face of the substrate and coupled to the first terminal;
   a second heavily doped region having the first conductivity type formed within the second lightly doped region at the face of the substrate and coupled to the second terminal;
   a third heavily doped region having the second conductivity type formed at least partially within the first lightly doped region at the face of the substrate between the first and second heavily doped regions and electrically connected to the second lightly doped region, wherein a space between the first and third heavily doped regions determines a switching voltage of the circuit; and
   a transistor having a current path coupled between the third heavily doped region and the second terminal and having a control terminal coupled to receive a control voltage, wherein the transistor is on in response to a first value of the control voltage, and wherein the transistor is off in response to a second value of the control voltage.

2. A circuit as in claim 1, wherein the third heavily doped region is spaced apart from the first heavily doped region without intervening dielectric isolation.

3. A circuit as in claim 1, comprising:
   a fourth heavily doped region having the first conductivity type in electrical contact with the first lightly doped region and the first terminal; and
   a fifth heavily doped region having the second conductivity type in electrical contact with the second lightly doped region and the second terminal.

4. A circuit as in claim 1, comprising a fourth heavily doped region having the first conductivity type formed at the face of the substrate between the first and third heavily doped regions.

5. A circuit as in claim 4, wherein the fourth heavily doped region is spaced apart from the third heavily doped region without intervening dielectric isolation.

6. A circuit as in claim 5, wherein a space between the fourth and third heavily doped regions determines the switching voltage of the circuit.

7. A circuit as in claim 4, wherein the fourth heavily doped region abuts the third heavily doped region.

8. A circuit as in claim 1, wherein the control voltage is a power supply voltage of an integrated circuit.

9. A circuit formed on a substrate, comprising:
   a first terminal;
   a second terminal;
   a first lightly doped region having a first conductivity type formed on a second lightly doped region having a second conductivity type;
   a first heavily doped region having the second conductivity type formed within the first lightly doped region at a face of the substrate and coupled to the first terminal;
   a second heavily doped region having the first conductivity type formed within the second lightly doped region at the face of the substrate and coupled to the second terminal;
   a third heavily doped region having the second conductivity type formed at least partially within the first lightly doped region at the face of the substrate between the first and second heavily doped regions and electrically connected to the second lightly doped region, wherein a space between the first and third heavily doped regions determines a switching voltage of the circuit; and
   a first programmable resistive element coupled between the third heavily doped region and the second terminal.

10. A circuit as in claim 9, wherein the first programmable resistive element determines a holding voltage of the circuit.

11. A circuit as in claim 9, comprising a fourth heavily doped region having the first conductivity type formed at the face of the substrate between the first and third heavily doped regions.

12. A circuit as in claim 11, wherein the fourth heavily doped region is spaced apart from the third heavily doped region without intervening dielectric isolation.

13. A circuit as in claim 11, comprising a second programmable resistive element coupled between the fourth heavily doped region and the first terminal.

14. A circuit as in claim 11, wherein a space between the fourth and third heavily doped regions determines the switching voltage of the circuit.

15. A circuit as in claim 11, wherein the fourth heavily doped region abuts the third heavily doped region.

16. A circuit formed on a substrate, comprising:
   a first terminal;
   a second terminal;
   a first lightly doped region having a first conductivity type formed on a second lightly doped region having a second conductivity type;
   a first heavily doped region having the second conductivity type formed within the first lightly doped region at a face of the substrate and coupled to the first terminal;
   a second heavily doped region having the first conductivity type formed within the second lightly doped region at the face of the substrate and coupled to the second terminal;
   a third heavily doped region having the second conductivity type formed between the first and second heavily doped regions and electrically connected to the second lightly doped region, wherein a space between the first and third heavily doped regions determines a switching voltage of the circuit;
   a second transistor having a current path coupled between the first terminal and the substrate and having a control terminal coupled to the first terminal;
   a third transistor having a current path coupled between the first lightly doped region and the second terminal and having a control terminal coupled to the second terminal; and
   a first transistor having a current path coupled between the third heavily doped region and the second terminal.

17. A circuit as in claim 16, wherein the first transistor determines a holding voltage of the circuit.

18. A circuit as in claim 16, comprising a fourth heavily doped region having the first conductivity type formed at the face of the substrate between the first and third heavily doped regions.

19. A circuit as in claim 18, comprising a fourth transistor having a current path coupled between the fourth heavily doped region and the first terminal.

20. A circuit as in claim 18, wherein a space between the fourth and third heavily doped regions determines the switching voltage of the circuit.

\* \* \* \* \*